United States Patent

Takei et al.

[11] Patent Number: 6,110,391
[45] Date of Patent: Aug. 29, 2000

[54] METHOD OF MANUFACTURING A BONDING SUBSTRATE

[75] Inventors: Tokio Takei; Susumu Nakamura; Kazushi Nakazawa, all of Nagano, Japan

[73] Assignee: Shin-Etsu Handotai Co., Ltd., Tokyo, Japan

[21] Appl. No.: 08/998,622

[22] Filed: Dec. 29, 1997

[30] Foreign Application Priority Data

Jan. 17, 1997 [JP] Japan .................................. 9-017685

[51] Int. Cl.[7] .............................. H01L 21/00; B44C 1/22
[52] U.S. Cl. .................. 216/2; 216/33; 216/38; 216/52; 216/88; 438/690; 438/692
[58] Field of Search ................... 216/33, 38, 52, 216/2, 88; 438/690, 691, 692, 693

[56] References Cited

U.S. PATENT DOCUMENTS

| | | | |
|---|---|---|---|
| 5,494,849 | 2/1996 | Iyer et al. | 438/693 X |
| 5,863,829 | 1/1999 | Nakayoshi et al. | 438/734 X |

FOREIGN PATENT DOCUMENTS

| | | |
|---|---|---|
| 59-175729 | 10/1984 | Japan . |
| 64-89346 | 4/1989 | Japan . |
| 3-89519 | 4/1991 | Japan . |
| 3-250616 | 11/1991 | Japan . |
| 4-263425 | 9/1992 | Japan . |
| 5-46086 | 2/1993 | Japan . |
| 6-176993 | 6/1994 | Japan . |
| 7-45485 | 2/1995 | Japan . |
| 9-17984 | 1/1997 | Japan . |

Primary Examiner—William Powell
Attorney, Agent, or Firm—Oliff & Beridge, PLC

[57] ABSTRACT

A method of manufacturing a bonding substrate is disclosed. An oxide film is formed on at least one of two semiconductor substrates, and the two substrates are brought into close contact with each other via the oxide film. The substrates are heat-treated in an oxidizing atmosphere in order to firmly join the substrates together. Subsequently, the peripheral portion of a device-fabricating substrate is ground to a predetermined thickness, and an unjoined portion at the periphery of the device-fabricating substrate is completely removed through etching. The device-fabricating substrate is then ground and/or polished in order to reduce the thickness of the device-fabricating substrate to a desired thickness. The step of grinding the peripheral portion of the device-fabricating substrate to a predetermined thickness is performed by relative and radial movement of a grinding stone from the peripheral portion of the substrate toward the center thereof. The method enables grinding of a peripheral portion of the device-fabricating substrate for the purpose of removing an unjoined portion such that the device-fabricating substrate is ground to as small a thickness as possible in order to increase productivity while reducing costs. The method also prevents damage from reaching the support substrate even when the device-fabricating substrate is ground to such a small thickness.

15 Claims, 2 Drawing Sheets

METHOD OF MANUFACTURING A BONDING SUBSTRATE

BACKGROUND OF THE INVENTION

1. Field of the Invention

The present invention relates to a method of manufacturing a bonding substrate composed of two substrates bonded together, and more particularly to a method of manufacturing a so-called bonding SOI (Silicon on Insulator) substrate in which two silicon monocrystalline substrates, or a silicon monocrystalline substrate and an insulator substrate are bonded together via a silicon oxide film.

2. Description of the Related Art

There have been known various methods of manufacturing a bonding SOI substrate in which two silicon monocrystalline substrates are bonded together via a silicon oxide film. In the method shown, for example, in Japanese Patent Publication (kokoku) 5-46086, an oxide film is formed on at least one of two substrates; the two substrates are brought into close contact with each other with no foreign substance being interposed between the joint surfaces thereof; and the substrates are then subjected to heat treatment at a temperature of about 200 to 1200° C. in order to increase joint strength.

Since a bonding substrate whose joint strength has been increased by means of thermal treatment can undergo a subsequent grinding and polishing process, the thickness of one substrate on which devices are to be fabricated can be reduced to a desired thickness through grinding or polishing in order to obtain an SOI layer for formation of semiconductor device.

However, it is known that a bonding substrate manufactured in the above-described manner has an unjoined portion in an area extending about 1–3 mm from the peripheral edge of the substrate. In order to remove such an unjoined portion, there have been developed various techniques such as those shown in Japanese Patent Application Laid-Open (kokai) Nos. 3-89519, 4-263425, 3-250616, and 64-89346.

Although these methods can remove such an unjoined portion, they have the following drawbacks. In the techniques disclosed in Japanese Patent Application Laid-Open Nos. 3-89519 and 4-263425 in which the peripheral portion of one substrate on which devices are to be fabricated (bond wafer) is ground to reach the other substrate which serves as a support substrate (base wafer), the shape of the base wafer changes greatly from the original shape. In the technique disclosed in Japanese Patent Application Laid-Open No. 3-250616 in which a piece of masking tape is applied to a wafer to cover the entire wafer except the peripheral portion, and then etching is performed in order to remove the unjoined portion at the periphery of the wafer, the process becomes complicated. In the technique disclosed in Japanese Patent Application Laid-Open No. 64-89346 in which the entire peripheral portion of a bonded wafer is removed through etching, the production requires a prolonged period of time and high costs and the productivity is low.

In order to solve these problems, there has been proposed another method of manufacturing a bonding substrate as disclosed in Japanese Patent Application Laid-Open (kokai) No. 7-45485. In this method, an oxide film is formed on the surface of at least one of two wafers (bond and base wafers); the two wafers are brought into close contact with each other via the oxide film; the wafers are heat-treated in an oxidizing atmosphere in order to firmly join the wafers together; an unjoined portion at the periphery of the bond wafer is completely removed; and the bond wafer is ground/polished to a desired thickness, wherein the complete removal of the unjoined portion at the periphery of the bond wafer is carried in such a way that the peripheral portion of the bond wafer is first removed through grinding to a thickness such that damage does not reach the base wafer, and the unjoined portion at the periphery of the bond wafer is completely removed through etching.

The above-described methods have advantages that the shape of the base wafer is not changed, that masking tape or the like is not required to be used, and that the process does not become complicated unreasonably.

However, when the unjoined portion at the peripheral portion of the bond wafer is removed through grinding, damage may reach the base wafer unless the grinding is stopped such that the unjoined portion still has a considerably large thickness. If damage reaches the base wafer, there arises a problem that when the unjoined portion at the periphery of the bond wafer is completely removed by subsequent etching, etchant may reach the surface of the base wafer via the damaged buried oxide layer and form a scratch or depression in the surface, thereby decreasing yield in the subsequent device-fabrication step.

If the grinding amount of the peripheral portion of the bond wafer is decreased, the above-described problem can be solved. However, in this case, an amount of etching stock removal increases and therefore the etching process requires a prolonged period of time and increased costs such as that of etchant, thereby losing the advantage of mechanical grinding. From this, it may be concluded that the above-described method in which the entire peripheral edge of the bond wafer is removed through etching is preferable because of its fewer number of process steps.

SUMMARY OF THE INVENTION

The present invention has been accomplished to solve the above-mentioned problems, and an object of the invention is to provide a method of manufacturing a bonding substrate, which method enables grinding of a peripheral portion of a bond wafer for the purpose of removing an unjoined portion such that the bond wafer is ground to as small a thickness as possible in order to increase productivity while reducing costs, and which method prevents damage from reaching a base wafer even when the bond wafer is ground to such a small thickness.

To achieve the above object, the present invention provides a method of manufacturing a bonding substrate, the method comprising the steps of forming an oxide film on at least one of two semiconductor substrates; bringing the two substrates into close contact with each other via the oxide film; heat-treating the substrates in an oxidizing atmosphere in order to firmly join the substrates together; grinding the periphery of a substrate on which a device is to be fabricated (hereinafter referred to as the "device-fabricating substrate") to a predetermined thickness; completely removing an unjoined portion at the periphery of the device-fabricating substrate through etching; and grinding and/or polishing the device-fabricating substrate in order to reduce the thickness of the device-fabricating substrate to a desired thickness, wherein the step of grinding the peripheral portion of the device-fabricating substrate to a predetermined thickness is performed by relative and radial movement of a grinding stone from the peripheral portion of the substrate toward the center thereof.

When the grinding of the peripheral portion of the device-fabricating substrate to a predetermined thickness is performed by relative and radial movement of a grinding stone from the peripheral portion of the substrate toward the center thereof as described above, damage in the direction of thickness of the wafer decreases, so that the bond wafer can be ground to a small thickness without generation of damage in the base wafer.

The present invention also provides a method of manufacturing a bonding substrate, the method comprising the steps of bringing a semiconductor substrate and an insulator substrate into close contact with each other; heat-treating the substrates in an oxidizing atmosphere in order to firmly join the substrates together; grinding the peripheral portion of the semiconductor substrate to a predetermined thickness; completely removing an unjoined portion at the periphery of the semiconductor substrate through etching; and grinding and/ or polishing the semiconductor substrate in order to reduce the thickness of the semiconductor substrate to a desired thickness, wherein the step of grinding the peripheral portion of the semiconductor substrate to a predetermined thickness is performed by relative and radial movement of a grinding stone from the peripheral portion of the substrate toward the center thereof.

As described above, the present invention can be applied not only to the case where two semiconductor substrates are joined but also to the case where a semiconductor substrate and an insulator substrate are joined together and the unjoined portion is removed at the peripheral portion of the semiconductor substrate in order to manufacture a bonding substrate.

In the methods according to the present invention, the grinding of the peripheral portion of the semiconductor substrate is preferably performed such that the thickness of the device-fabricating substrate is reduced to a thickness of 20–150 microns.

As described above, in the present invention, the substrate serving as a bond wafer can be ground to a thickness of 20–150 microns without generation of damage in the substrate serving as a base wafer. Therefore, the time required for a successive etching process can be shortened, and a bonding substrate of high quality can be manufactured with high productivity and at low cost.

DESCRIPTION OF THE PREFERRED EMBODIMENT

Figure 1A:
FIGS. 1A–1G are diagrams illustrating a general process for manufacturing a bonding substrate according to the present invention.

With reference to the drawing, an embodiment of the present invention will next be described for a case where two semiconductor substrates are joined together. However, the present invention is not limited thereto.

Figure 1B:
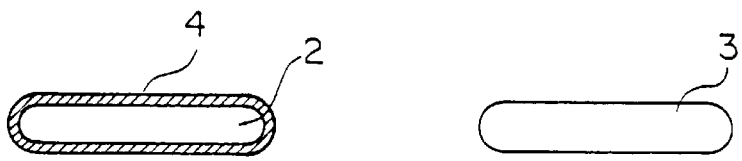

With reference to FIGS. 1A–1G, the method according to the present invention will now be described step by step. First, material wafers (monocrystalline silicon mirror-polished wafers having a diameter of 5 inches and a <100> orientation, which are manufactured in accordance with, for example, the Czochralski method) are prepared as a bond wafer 2 and a base wafer 3 (FIG. 1A). Among the prepared silicon monocrystalline wafers, the bond wafer 2 is heat-treated such that an oxide film 4 is formed on the surface thereof (FIG. 1B).

Figure 1C:
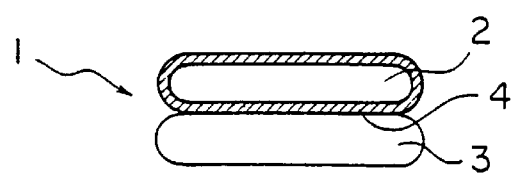
Figure 1D:
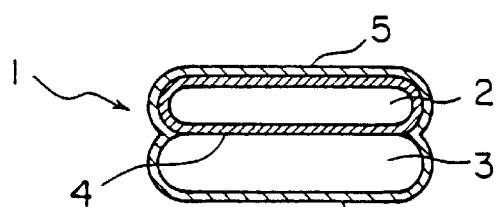

Subsequently, the bond wafer 2 with the oxide film 4 is brought into close contact with the base wafer 3 in a clean atmosphere (FIG. 1C). The bond wafer 2 and the base wafer 3 are then heat-treated in an oxidizing atmosphere in order to firmly join the bond wafer 2 and the base wafer 3 so as to yield a bonding substrate 1. The heat treatment is performed at a temperature of 200–1200° C. in an atmosphere that contains oxygen or water vapor (FIG. 1D). At this time, the bond wafer 2 and the base wafer 3 are firmly joined together, and an oxide film 5 is formed on the entire outer surface of the bonding substrate 1. The oxide film 5 serves as an etching film in a subsequent step.

In an area extending about 2 mm from the peripheral edge of the bonding substrate 1, the bond wafer 2 and the base wafer 3 have an unjoined portion. The unjoined portion must be removed because such an unjoined portion cannot be used as an SOI layer for fabrication of semiconductor devices, and may peel off in a subsequent process and cause various problems.

Figure 1E:
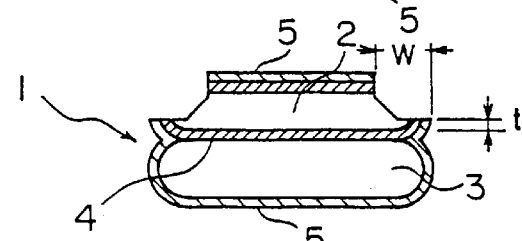

In order to remove the unjoined portion, as shown in FIG. 1E, the peripheral portion of the bond wafer 2 where the unjoined portion exists is ground such that the thickness of the unjoined portion decreases to a predetermined thickness t. The grinding operation can remove the unjoined portion with high speed and high accuracy.

In this case, the predetermined thickness t is preferably made as small as possible in order to reduce the amount of etching stock removal in an etching step, which is subsequent to the step of removing the unjoined portion.

It is well known that when a silicon wafer is mechanically ground, mechanical damage is generated in the wafer, unlike the case of etching. Therefore, if the predetermined thickness t is reduced excessively, damage such as mechanical damage reaches the buried oxide layer 4 or the base wafer 3. In this case, when the unjoined portion at the periphery of the bond wafer 2 is completely removed by subsequent etching, etchant may reach the surface of the base wafer 3 via the damaged buried oxide layer 4 and form a scratch or depression in the surface, thereby decreasing the yield in the subsequent device-forming step.

Therefore, it is important to determine a way of grinding the peripheral portion of the bond wafer 2 to as small a thickness as possible without imparting damage to the buried oxide layer 4 or the base wafer 3.

Figures 3A, 3B:
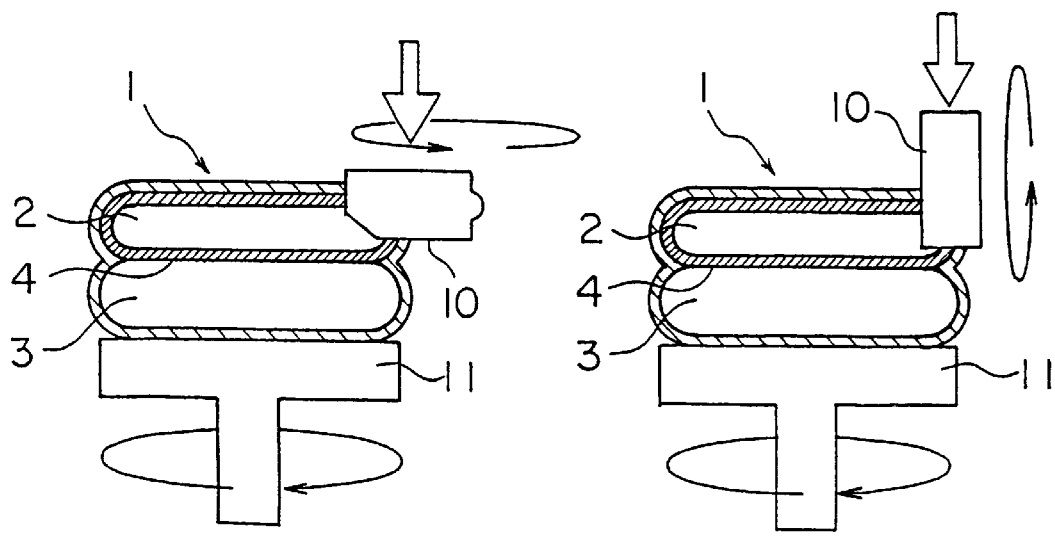
FIGS. 3A and 3B are explanatory diagrams each showing the case where the peripheral portion of a bond wafer is ground to a predetermined thickness according to a conventional method.

Conventionally, as shown in FIGS. 3A and 3B, the peripheral portion of the bond wafer 2 is ground in such a way that a bonding wafer 1 is fixedly supported on a rotatable stage 11 which is then rotated, and a rotating grinding wheel 10 is caused to approach the bond wafer 2 from above (i.e., from the main-face side) in order to grind the peripheral portion of the bond wafer 2 in the thicknesswise direction of the substrate.

However, as a result of experimental studies performed by the inventors of the present invention, it was found that when the grinding wheel 10 is pressed against the bond wafer 2 in the thicknesswise direction of the wafer, damage caused by grinding is likely to be generated in the advancing direction of the grinding wheel 10, and therefore the buried oxide layer 4 or the surface of the base wafer 3 is apt to be damaged. Therefore, in the conventional method, the amount of the bond wafer 2 removed by grinding must be restricted such that the ground portion of the bond wafer 2 has a thickness of at least 150 microns as a predetermined thickness t.

If the ground portion of the bond wafer 2 has a thickness of 150 microns or more, an amount of etching stock removal by a subsequent etching process becomes larger, and therefore the etching process requires a prolonged period of time (e.g., 4 hours or more) and increased costs such as that of etchant, thereby losing the advantage of mechanical grinding.

Figure 2:
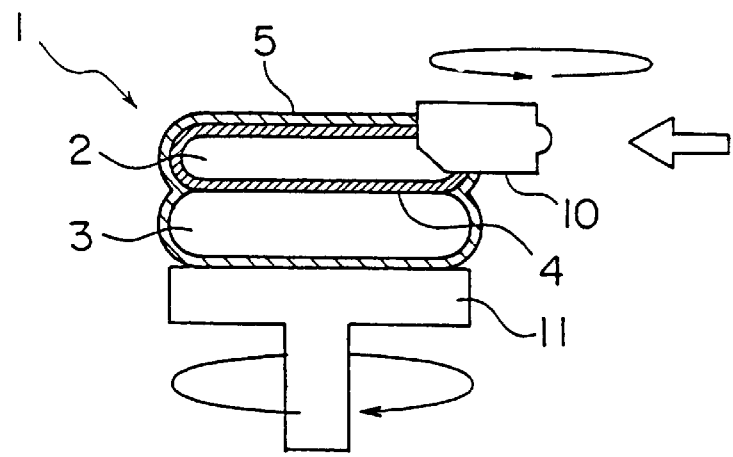
FIG. 2 is an explanatory diagram showing the case where the peripheral portion of a bond wafer is ground to a predetermined thickness according to the present invention.

Therefore, in the present invention, in order to grind the peripheral portion of the bond wafer 2 to a predetermined thickness t, the grinding wheel 10 is moved radially in relation to the bond wafer 2 such that, as shown in FIG. 2, the grinding wheel 10 moves from the peripheral portion toward the center of the bond wafer 2.

In this case, while heights of the bonding substrate 1 and the grinding wheel 10 and distance therebetween are maintained constant and the bonding substrate 1 and the grinding wheel 10 are rotated in opposite directions by unillustrated rotation mechanisms, the grinding wheel 10 is moved horizontally by an unillustrated feed mechanism in order to grind the peripheral portion of the bond wafer 2 toward the center portion of the wafer. Conversely, the stage 11 may be moved horizontally by an unillustrated feed mechanism while the position of the grinding wheel 10 is fixed, in order to press the peripheral portion of the bond wafer 2 against the grinding wheel 10.

The predetermined thickness t of the ground peripheral portion of the bond wafer 2 can be controlled through adjustment of the positional relationship between the grinding wheel 10 and the bond wafer 2 in the vertical direction.

In the present invention, the predetermined thickness t can be set to fall within the range of 20–150 microns through adjustment of the positional relationship between the grinding wheel 10 and the bond wafer 2 in the vertical direction.

In the present invention, since the bond wafer 2 is ground from the periphery toward the center of the bond wafer 2, damage is generated in a direction toward the center of the wafer, which is the advancing direction of the grinding wheel, so that damage is hardly generated in the thicknesswise direction.

Therefore, even when the peripheral portion of the bond wafer 2 is ground to a thickness as small as 20–150 microns, damage does not reach the buried oxide layer 4 or the base wafer 3.

Although the degree of damage generated toward the center of the bond wafer 2 increases, the problem can be solved through reduction in the width w of the peripheral portion of the bond wafer 2 to be ground by the grinding wheel 10 and removal of the generated damage through etching in a subsequent step.

In this way, the method of the present invention enables the peripheral portion of the bond wafer 2 to be ground to a thickness as small as 20–150 microns, without imparting damage to the buried oxide layer 4 or the base wafer 3.

However, even when the wafer is radially ground from the periphery thereof, damage of approximately 10 microns is generated in the thicknesswise direction of the wafer. Therefore, if the wafer is ground to a thickness less than 20 microns, there arises a possibility that the base wafer 3 may be damaged. Therefore, such excessive grinding is not preferred.

Figure 1F:
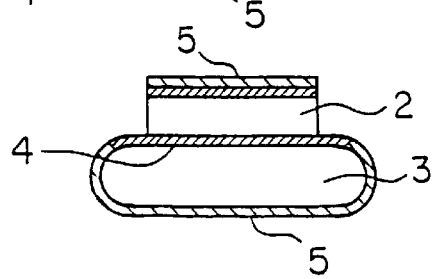

Subsequently, as shown in FIG. 1F, the unjoined portion at the periphery of the bond wafer 2 is completely removed through etching. This etching can be performed through immersion of the bonding wafer 1 into an etchant whose etching speed for silicon monocrystal is greatly higher that that for oxide film. That is, although the peripheral portion of the bond wafer 2 is etched by the etchant because the silicon has been exposed through grinding, the remaining portions of the bonding substrate 1 are not etched because these portions are covered by the oxide film 5. An example of etching that exhibits selectivity is alkali etching utilizing KOH, NaOH, or the like.

In the present invention, since the thickness of the peripheral portion of the bond wafer 2 is sufficiently reduced, the unjoined portion at the periphery of the bonding substrate 1 can be completely removed in a short period of time through etching.

Figure 1G:
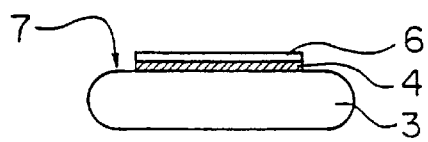

Finally, as shown in FIG. 1G, the surface of the bond wafer 2 is ground and/or polished in an ordinary manner in order to reduce the thickness of the bond wafer 2 to a desired thickness. Thus, a bonding substrate having an SOI layer 6 is manufactured.

EXAMPLES

Next, descriptions will be given of an example of the present invention and a comparative example.

Example and Comparative Example

Twenty mirror-polished CZ substrates having a diameter of 125 mm (5 inches) and a thickness of 625 microns (conductive type: p type; resistivity: 4–6 $\Omega$·cm) were prepared and divided into 10 bond wafers and 10 base wafers. These wafers were joined in accordance with the processes shown in FIGS. 1A–1D in order to yield 10 bonding substrates as shown in FIG. 1D.

For five of the thus-manufactured bonding substrates, as shown in FIG. 2, the peripheral portion of each wafer was radially ground from the periphery toward the center of the wafer (Example). Meanwhile, for the remaining five bonding substrates, as shown in FIG. 3A, the peripheral portion of each wafer was ground in the thicknesswise direction of the wafer (Comparative Example).

The grinding was performed through use of a #800 diamond grinding wheel, which was rotated at a peripheral speed of 1600 m/min in the direction opposite to that of the wafer, which was rotated at a peripheral speed of 300 mm/min. The grinding was performed through the advancing speed of 0.6 mm/min. The peripheral portion of the bond wafer radially extending over about 3 mm was ground until the thickness of the peripheral portion became 100 microns. The above-described conditions apply to both the Example and the Comparative Example, which differed only in the advancing direction of the grinding wheel.

The ten bonding wafers whose bond wafers had ground peripheral portions were immersed into a solution of 50% NaOH at 70° C. for about 3.5 hours, which was a condition for etching a silicon monocrystal of a thickness of about 130 microns, in order to completely remove the unjoined portion at the periphery of the wafer.

Subsequently, ordinary grinding/polishing was carried out for the bonding wafers to complete the manufacture of a bonding substrate having an SOI layer of 2 micron thickness as shown in FIG. 1G.

Scratches existing on the surface the terrace portion 7 of the base wafer 3 of each of the ten thus-manufactured SOI substrates were counted through use of an optical microscope.

Although 20–50 scratches were observed in each of the wafers that had been ground by the method of the Comparative Example (conventional method), scratches that were considered to stem from grinding were not detected in the wafers that had been ground by the method according to the present invention.

The present invention is not limited to the above-described embodiment. The above-described embodiment is a mere example, and those having the substantially same structure as that described in the appended claims and providing the similar action and effects are included in the scope of the present invention.

In the above-described embodiment, a description is focused on the case where two semiconductor substrates are joined together in order to manufacture a bonding substrate. However, the present invention is also effective in removing peripheral unjoined portions that are produced in a manufacturing process in which a bonding substrate is manufactured through joining of a semiconductor wafer and an insulator substrate made of quartz, silicon carbide, silicon nitride, alumina, sapphire, or other ceramic materials.

What is claimed is:

1. A method of manufacturing a bonding substrate, comprising:

forming an oxide film on at least one of two semiconductor substrates;

bringing the two substrates into close contact with each other via the oxide film;

heat-treating the substrates in an oxidizing atmosphere in order to firmly join the two substrates together, one of the two substrates being a device-fabricating substrate;

radially moving a grinding stone relative to the device-fabricating substrate from the peripheral portion of the device-fabricating substrate toward the center of the device-fabricating substrate so as to grind the peripheral portion of the device-fabricating substrate to a desired thickness;

completely removing an unjoined portion at the peripheral portion of the device-fabricating substrate by etching; and reducing the thickness of the device-fabricating substrate to a desired thickness.

2. A method of manufacturing a bonding substrate according to claim 1, wherein said grinding of the peripheral portion of the semiconductor substrate reduces the thickness of the device-fabricating substrate to a thickness of 20–150 microns.

3. A method of manufacturing a bonding substrate, comprising:

bringing a semiconductor substrate and an insulator substrate into close contact with each other;

heat-treating the substrates in an oxidizing atmosphere in order to firmly join the substrates together;

radially moving a grinding stone relative to the semiconductor substrate from the peripheral portion of the semiconductor substrate toward the center of the semiconductor substrate to grind the peripheral portion of the semiconductor substrate to a desired thickness;

completely removing an unjoined portion at the peripheral portion of the semiconductor substrate by etching; and reducing the thickness of the semiconductor substrate to a desired thickness.

4. A method of manufacturing a bonding substrate according to claim 3, wherein said grinding of the peripheral portion of the semiconductor substrate reduces the thickness of the semiconductor substrate to a thickness of 20–150 microns.

5. A method of manufacturing a bonding substrate according to claim 3, wherein said reducing the thickness of the semiconductor substrate comprises grinding the semiconductor substrate to the desired thickness.

6. A method of manufacturing a bonding substrate according to claim 3, wherein said reducing the thickness of the semiconductor substrate comprises polishing the semiconductor substrate to the desired thickness.

7. A method of manufacturing a bonding substrate according to claim 3, wherein said reducing the thickness of the semiconductor substrate comprises grinding and polishing the semiconductor substrate to the desired thickness.

8. A method of manufacturing a bonding substrate according to claim 1, wherein said reducing the thickness of the device-fabricating substrate comprises grinding the device-fabricating substrate to the desired thickness.

9. A method of manufacturing a bonding substrate according to claim 1, wherein said reducing the thickness of the device-fabricating substrate comprises polishing the device-fabricating substrate to the desired thickness.

10. A method of manufacturing a bonding substrate according to claim 1, wherein said reducing the thickness of the device-fabricating substrate comprises grinding and polishing the device-fabricating substrate to the desired thickness.

11. A method of manufacturing a bonding substrate, comprising:

providing a first substrate and a second substrate, the first substrate being selected from the group consisting of semiconductor substrates and insulator substrates and the second substrate being a semiconductor substrate;

bringing the first and second substrates into close contact with each other;

heat-treating the first and second substrates in an oxidizing atmosphere in order to firmly join the first and second substrates together;

radially grinding the second substrate from the peripheral portion of the second substrate toward the center of the second substrate so as to grind the peripheral portion to a desired thickness;

completely removing an unjoined portion at the peripheral portion of the second substrate by etching; and reducing the thickness of the second substrate to a desired thickness.

12. A method of manufacturing a bonding substrate according to claim 11, wherein the grinding of the peripheral portion of the second substrate reduces the thickness of the second substrate to a thickness of 20–150 microns.

13. A method of manufacturing a bonding substrate according to claim 11, wherein the reducing of the thickness of the second substrate comprises grinding the second substrate to the desired thickness.

14. A method of manufacturing a bonding substrate according to claim 11, wherein the reducing of the thickness of the second substrate comprises polishing the second substrate to the desired thickness.

15. A method of manufacturing a bonding substrate according to claim 11, wherein the reducing of the thickness of the second substrate comprises grinding and polishing the second substrate to the desired thickness.

* * * * *